(12) United States Patent
Zhao et al.

(10) Patent No.: US 11,805,373 B2
(45) Date of Patent: Oct. 31, 2023

(54) MEMS CHIP

(71) Applicant: AAC ACOUSTIC TECHNOLOGIES (SHENZHEN) CO., LTD., Shenzhen (CN)

(72) Inventors: Zhuanzhuan Zhao, Shenzhen (CN); Linlin Wang, Shenzhen (CN); Rui Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 93 days.

(21) Appl. No.: 17/562,017

(22) Filed: Dec. 27, 2021

(65) Prior Publication Data
US 2023/0164495 A1    May 25, 2023

(30) Foreign Application Priority Data
Nov. 24, 2021    (CN) ........................... 202111401107.3

(51) Int. Cl.
| | | |
|---|---|---|
| *H04R 19/04* | (2006.01) | |
| *B81B 3/00* | (2006.01) | |
| *H04R 7/04* | (2006.01) | |
| *H04R 7/08* | (2006.01) | |
| *H04R 7/18* | (2006.01) | |

(52) U.S. Cl.
CPC ............ *H04R 19/04* (2013.01); *B81B 3/007* (2013.01); *H04R 7/04* (2013.01); *H04R 7/18* (2013.01); *B81B 2201/0257* (2013.01); *B81B 2203/0127* (2013.01); *B81B 2203/0315* (2013.01); *B81B 2203/0353* (2013.01); *H04R 2201/003* (2013.01)

(58) Field of Classification Search
CPC ............ H04R 19/04; H04R 2201/0023; B81B 2203/01
See application file for complete search history.

(56) References Cited

U.S. PATENT DOCUMENTS

| | | | |
|---|---|---|---|
| 2020/0339411 A1* | 10/2020 | Chen | ........................ H04R 7/18 |
| 2020/0413204 A1* | 12/2020 | Tong | ...................... H04R 23/02 |
| 2021/0204069 A1* | 7/2021 | Wang | .................... B81B 3/0078 |

* cited by examiner

*Primary Examiner* — Sunita Joshi
(74) *Attorney, Agent, or Firm* — W&G Law Group

(57) ABSTRACT

The present disclosure discloses a MEMS chip which includes a substrate, a back plate fixed on the substrate, and a membrane fixed on the substrate and located above the back plate. A sealed space is formed between the membrane and the back plate. A support pillar is received in the sealed space. Two ends of the support pillar along a vibration direction of the membrane are separately fixed on the membrane and the back plate. As a result, when decreasing the volume of the back cavity, the resonance frequency of the MEMS chip has been effectively improved and the SNR is simultaneously high. Furthermore, the support pillar can effectively improve the reliability and crack resistance of the membrane.

8 Claims, 2 Drawing Sheets

MEMS CHIP

FIELD OF THE PRESENT DISCLOSURE

The present disclosure relates to micro-electromechanical systems, especially relates to a MEMS chip applied in mobile device.

DESCRIPTION OF RELATED ART

Micro-Electro-Mechanical System (MEMS) chips are widely applied in acoustic components, such as MEMS condenser microphone. In related art, the MEMS chip is sealed in a shell with an accommodation space. The MEMS chip includes a substrate with a back cavity and a capacitance system disposed on the substrate. The capacitance system includes a membrane and a back plate arranged at an interval. A sound hole is provided on the shell communicating the back cavity, thus allowing the membrane to move under external pressure wave.

Generally speaking, the high the resonance frequency of the membrane, the better the sensitivity of the MEMS chip. But, once the package structure is defined, the sound hole and the volume of the accommodation space are unchangeable. The resonance frequency of the membrane can only be improved by adjusting the membrane stiffness and the acoustic compliance of the back cavity. However, firstly, the sensitivity and signal noise ratio (SNR) of the MEMS chip would reduce with the increase of the membrane stiffness; secondly, volume decrease of the back cavity in a traditional way may increase the overlapped area between the membrane and the substrate, thus resulting in more noise and lower SNR.

Therefore, it is necessary to provide an improved MEMS chip to overcome the problems mentioned above.

SUMMARY OF THE INVENTION

The present disclosure provides a MEMS chip with higher resonance frequency and higher SNR.

The MEMS chip includes a substrate with a back cavity, a capacitance system disposed above the back cavity, and a support portion; the capacitance system includes a back plate fixed on the substrate, providing a plurality of through holes thereon; and a membrane located on one side of the back plate away from the substrate and opposite to the back plate for forming a sealed space communicated with the through holes; the support portion received in the sealed space; two ends of the support portion along a vibration direction of the membrane are separately fixed on the membrane and the back plate.

Further, the support portion is annular.

Further, the support portion extends along the vibration direction.

Further, the back plate includes a central portion and an edge portion surrounding the central portion, the through holes penetrate the central portion along the vibration direction of the membrane.

Further, the support portion is fixed on the central portion.

Further, the support portion is fixed on the edge portion.

Further, the support portion is a hollow structure or a solid structure.

Further, including a first support portion fixed on the substrate; the edge portion is fixed on one side of the first support portion away from the substrate.

Further, including a second support portion fixed on the substrate and surrounding the first support portion; the second support portion has a greater length than the first support portion along the vibration direction; the membrane is supported above the back plate by the second support portion.

Further, the back plate further includes an upper surface facing the membrane and a protrusion extending from the upper surface towards the membrane; the protrusion is spaced apart from the membrane along the vibration direction.

BRIEF DESCRIPTION OF THE DRAWINGS

The present disclosure will hereinafter be described in detail with reference to an exemplary embodiment. To make the technical problems to be solved, technical solutions and beneficial effects of present disclosure more apparent, the present disclosure is described in further detail together with the figures and the embodiment. It should be understood the specific embodiment described hereby is only to explain this disclosure, not intended to limit this disclosure.

DETAILED DESCRIPTION OF THE EXEMPLARY EMBODIMENTS

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

It should be noted that the description of "first", "second" and the like in the present disclosure is only used for description purposes, and cannot be understood as indicating or implying its relative importance or implying the number of indicated technical features. Thus, a feature defined as "first" or "second" may include at least one such feature, either explicitly or implicitly. In addition, the technical solutions among the various embodiments can be combined with each other, but it must be based on that it can be realized by ordinary technicians. When the combination of the technical solutions is contradictory or cannot be realized, it should be considered that the combination of the technical solutions does not exist, nor is it within the scope of protection required by the present disclosure.

Figure 1:
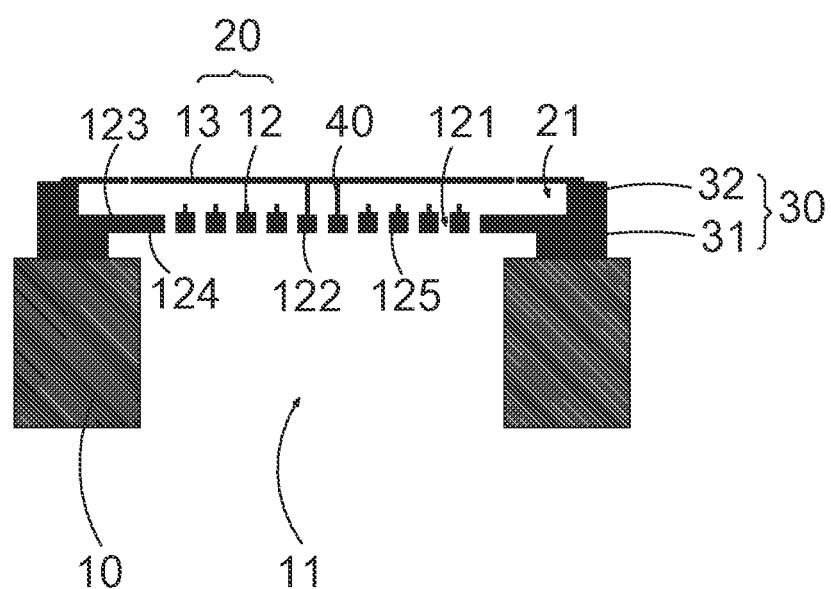
FIG. 1 is a cross-sectional view of a MEMS chip in accordance with an exemplary embodiment of the present disclosure.

Please refer to FIGS. 1, a MEMS chip 100 provided by an exemplary embodiment of the present disclosure includes a substrate 10 with a back cavity 11 and a capacitance system 20 disposed on the substrate 10. Moreover, the capacitance system 20 includes a back plate 12 and a membrane 13. The back plate 12 and the membrane are arranged at an interval for providing vibration space for the membrane 13. When the membrane 13 vibrates under acoustic wave, the capacitance value of the capacitance system 20 varies with the distance between the back plate 12 and the membrane 13, therefore achieving acoustoelectric conversion. Specifically, the membrane 13 is located on one side of the back plate 12 away from the substrate 10. And, the back plate 13 is opposite to the membrane 13 for forming a sealed space 21.

Please refer to FIG. 1, it can be understood that the back cavity 11 penetrates the substrate 10 along a vibration direction of the membrane 13. The substrate 10 supports the capacitance system 20 over the back cavity 11. In this embodiment, the back plate 12 is fixed on the substrate 10. The membrane 13 is located on one side of the back plate 12 away from the substrate 10. In addition, a plurality of through holes 121 is provided on the back plate 12. The through holes 121 penetrate the back plate 12 along a vibration direction of the membrane 12 so that the back cavity 11 communicates with the sealed space 21 by the through holes 121. In this manner, the acoustic wave can reach the membrane 13 from the back cavity 11, the through holes 121 and the sealed space 21 successively.

In this embodiment, the MEMS chip 100 further includes a support structure 30 fixed on the substrate 10 to support the capacitance system 20 to be above the back cavity 11. Specifically, the support structure 30 includes a first support portion 31 and a second support portion 32. The first support portion 31 is fixed on the substrate 10; the back plate 12 is fixed on one side of the first support portion 31 away from the substrate 10; the second support portion 32 is located on external side of the first support portion 31 and surrounds the first support portion 31. And, along the vibration direction, the second support portion 32 has a greater length than the first support portion 31. Thus, the membrane 13 can be supported above the back plate 12 by the second support portion 32. It can be understood that an edge of the back plate 12 is fixed on the first support portion 31 and an edge of the membrane 13 is fixed on the second support portion 32. Please refer to FIG. 1, the back plate 12 includes a central portion 122 and an edge portion 123 surrounding the central portion 122, the through holes 121 penetrate the central portion 122 along the vibration direction of the membrane 13. The first support portion 31 supports the edge portion 123 of the back plate 12.

Generally speaking, with the decrease of the volume of the back cavity, the overlapped area of the membrane and the substrate along the vibration direction may be increased, unexpectedly resulting in extra acoustic noise and lower SNR of the MEMS chip. In the present disclosure, the membrane 13 is located on the side of the back plate 12 away from the substrate, thus increasing the distance between the membrane 13 and the substrate 10. In this way, even if the volume of the back cavity is decreased, no more noise would be caused, effectively keeping high SNR.

In addition, the MEMS chip 100 includes a support pillar 40 received in the sealed space 21. Along the vibration direction of the membrane 13, one end of the support pillar 40 is fixed on the membrane 13, and the other end of the support pillar 40 is fixed on the back plate 12. As a result, the membrane 13 has stronger fixation and higher stability, effectively avoiding fracture under air blast. Further, the support pillar 40 is annular. In other embodiment. The MEMS chip 100 has a plurality of support pillars 40; the support pillars 40 are spaced apart from each other.

Figure 2:
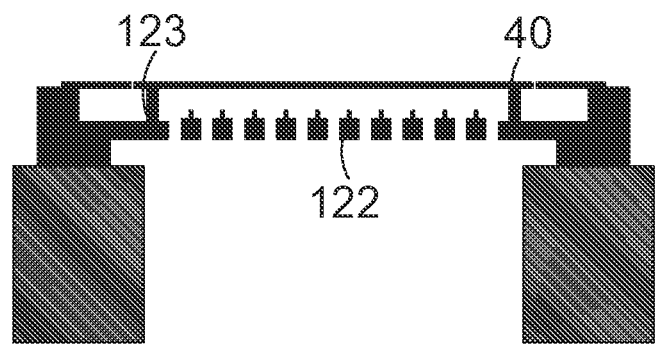
FIG. 2 is a cross-sectional view of a MEMS chip in accordance with another exemplary embodiment of the present disclosure.

It can be understood that the support pillar 40 extends along the vibration direction of the membrane 13. As shown in FIG. 1, the support pillar 40 is fixed on the central portion 122 of the back plate 12. In another embodiment shown in FIG. 2, the support pillar 40 is fixed on the edge portion 123 of the back plate 12. Further, the support pillar 40 can be a hollow structure or a solid structure.

Further, the back plate 12 includes a lower surface 124 facing the membrane 13 and a protrusion 125 protruding from the lower surface 124 towards the membrane 13. The protrusion 125 is spaced apart from the membrane 13. When the membrane 13 vibrates, the protrusion 125 can avoid the adhesion between the back plate 12 and the membrane 13.

Compared with the related art, in the embodiment of the present disclosure, the MEMS chip includes a substrate, a back plate fixed on the substrate, and a membrane fixed on the substrate and located above the back plate. A sealed space is formed between the membrane and the back plate. A support pillar is received in the sealed space. Two ends of the support pillar along a vibration direction of the membrane are separately fixed on the membrane and the back plate. As a result, when decreasing the volume of the back cavity, the resonance frequency of the MEMS chip has been effectively improved and the SNR is simultaneously high. Furthermore, the support pillar can effectively improve the reliability and crack resistance of the membrane.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS chip comprising:
a substrate with a back cavity;
a first support portion fixed on the substrate;
a capacitance system disposed above the back cavity, including:
a back plate fixed on the substrate, providing a plurality of through holes thereon; and
a membrane located on one side of the back plate away from the substrate and opposite to the back plate for forming a sealed space communicated with the through holes;
a support pillar received in the sealed space; wherein
two ends of the support pillar along a vibration direction of the membrane are separately fixed on the membrane and the back plate;
the back plate comprises a central portion and an edge portion surrounding the central portion, the through holes penetrate the central portion along the vibration direction of the membrane; the edge portion is fixed on one side of the first support portion away from the substrate.

2. The MEMS chip as described in claim 1, wherein the support pillar is annular.

3. The MEMS chip as described in claim 1, wherein the support pillar extends along the vibration direction.

4. The MEMS chip as described in claim 1, wherein the support pillar is fixed on the central portion.

5. The MEMS chip as described in claim 1, wherein the support pillar is fixed on the edge portion.

6. The MEMS chip as described in claim 1, wherein the support pillar is a hollow structure or a solid structure.

7. The MEMS chip as described in claim 1, further comprising a second support portion fixed on the substrate and surrounding the first support portion; the second support portion has a greater length than the first support portion along the vibration direction; the membrane is supported above the back plate by the second support portion.

8. The MEMS chip as described in claim 1, wherein the back plate further comprises an upper surface facing the membrane and a protrusion extending from the upper surface towards the membrane; the protrusion is spaced apart from the membrane along the vibration direction.

\* \* \* \* \*